(12) United States Patent
Belikoff et al.

(10) Patent No.: US 9,349,893 B2
(45) Date of Patent: May 24, 2016

(54) PHOTOVOLTAIC MODULE GROUND MOUNT

(71) Applicant: First Solar, Inc., Perrysburg, OH (US)

(72) Inventors: Michael A. Belikoff, Mendham, NJ (US); John Hartelius, Brick, NJ (US); Chris Mahn, Peoria, AZ (US)

(73) Assignee: First Solar, Inc., Perrysburg, OH (US)

( * ) Notice: Subject to any disclaimer, the term of this patent is extended or adjusted under 35 U.S.C. 154(b) by 92 days.

(21) Appl. No.: 14/165,889

(22) Filed: Jan. 28, 2014

(65) Prior Publication Data

US 2014/0202524 A1      Jul. 24, 2014

Related U.S. Application Data

(63) Continuation of application No. 12/794,307, filed on Jun. 6, 2010, now Pat. No. 8,667,748.

(60) Provisional application No. 61/184,618, filed on Jun. 5, 2009.

(51) Int. Cl.
| | | |
|---|---|---|
| *A47G 19/08* | (2006.01) | |
| *H01L 31/042* | (2014.01) | |
| *F24J 2/52* | (2006.01) | |
| *H02S 30/10* | (2014.01) | |

(52) U.S. Cl.
CPC ........... *H01L 31/0424* (2013.01); *F24J 2/5232* (2013.01); *F24J 2/5264* (2013.01); *H02S 20/00* (2013.01); *H02S 30/10* (2014.12); *F24J 2002/5277* (2013.01); *Y02B 10/12* (2013.01); *Y02E 10/47* (2013.01); *Y02E 10/50* (2013.01); *Y10T 29/49355* (2015.01); *Y10T 29/49826* (2015.01)

(58) Field of Classification Search
CPC . F24J 2/5232; F24J 2/5264; F24J 2002/5277; H02S 20/00; H02S 30/10; H01L 31/0424; Y02E 10/47; Y02E 10/50; Y02B 10/12; Y10T 29/49826; Y10T 29/49355
USPC .................................................... 211/26, 41.1
See application file for complete search history.

(56) References Cited

U.S. PATENT DOCUMENTS

| | | |
|---|---|---|
| 4,114,595 A | 9/1978 | Barker |
| 4,269,173 A | 5/1981 | Krueger et al. |
| 4,421,943 A | 12/1983 | Withjack |
| 5,125,608 A | 6/1992 | McMaster et al. |
| 5,308,037 A | 5/1994 | Gonzalez |
| 5,487,791 A | 1/1996 | Everman et al. |
| 5,664,874 A | 9/1997 | Winterer |
| 5,735,100 A | 4/1998 | Campbell |
| 6,065,255 A | 5/2000 | Stern et al. |
| 6,814,070 B2 | 11/2004 | Bourne et al. |
| 7,552,513 B2 | 6/2009 | Cheng |
| 2003/0019180 A1 | 1/2003 | Warren et al. |
| 2004/0231274 A1 | 11/2004 | Engstrom |

(Continued)

FOREIGN PATENT DOCUMENTS

| | | |
|---|---|---|
| CN | 1900458 A | 1/2007 |
| CN | 101095017 A | 12/2007 |

(Continued)

*Primary Examiner* — Korie H Chan
(74) *Attorney, Agent, or Firm* — Blank Rome LLP

(57) ABSTRACT

A photovoltaic module ground mounting system can include a collapsible photovoltaic module mounting assembly framework.

28 Claims, 19 Drawing Sheets

(56) References Cited

U.S. PATENT DOCUMENTS

| | | |
|---|---|---|
| 2005/0103376 A1 | 5/2005 | Matsushita et al. |
| 2006/0071437 A1 | 4/2006 | Blasco |
| 2007/0069542 A1 | 3/2007 | Steiger et al. |
| 2008/0016818 A1 | 1/2008 | Heirich |
| 2008/0223262 A1 | 9/2008 | Chew et al. |
| 2008/0264467 A1 | 10/2008 | Doko |
| 2009/0205703 A1 | 8/2009 | Umotoy et al. |
| 2009/0256046 A1 | 10/2009 | Hausner et al. |
| 2010/0071996 A1 | 3/2010 | Huang |
| 2010/0089433 A1 | 4/2010 | Conger |
| 2010/0127142 A1 | 5/2010 | Genschorek |
| 2010/0132274 A1 | 6/2010 | Reyal et al. |
| 2010/0154327 A1 | 6/2010 | Reyal et al. |
| 2010/0236183 A1 | 9/2010 | Cusson et al. |
| 2010/0237028 A1 | 9/2010 | Cusson |
| 2010/0237029 A1 | 9/2010 | Cusson et al. |
| 2010/0269446 A1 | 10/2010 | Merrifield |
| 2010/0307991 A1 | 12/2010 | Belikoff et al. |
| 2011/0072631 A1 | 3/2011 | Hartelius et al. |

FOREIGN PATENT DOCUMENTS

| | | |
|---|---|---|
| CN | 201014798 Y | 1/2008 |
| CN | 100424305 C | 10/2008 |
| CN | 101345269 A | 1/2009 |
| CN | 201188591 Y | 1/2009 |
| CN | 101387151 A | 3/2009 |
| CN | 201256369 Y | 6/2009 |
| CN | 201435696 Y | 3/2010 |
| CN | 201498521 U | 6/2010 |
| CN | 201576689 U | 9/2010 |
| CN | 201757526 U | 3/2011 |
| CN | 101387151 B | 5/2011 |
| EP | 0 993 051 A2 | 4/2000 |
| EP | 2 221 555 A1 | 8/2010 |
| EP | 2 339 262 A2 | 6/2011 |
| JP | 61-17193 | 5/1986 |
| JP | 4-49074 | 11/1992 |
| JP | 2000-160690 | 6/2000 |
| JP | 2006-278537 | 10/2006 |
| WO | WO 97/19291 A1 | 5/1997 |
| WO | WO 2006/072230 A1 | 7/2006 |
| WO | WO 2008/145903 A1 | 12/2008 |
| WO | WO 2009/015424 A1 | 2/2009 |
| WO | WO 2009/146511 A1 | 12/2009 |
| WO | WO 2010/045514 A2 | 4/2010 |
| WO | WO 2010/053089 A1 | 5/2010 |
| WO | WO 2010/057781 A2 | 5/2010 |
| WO | WO 2010/064656 A1 | 6/2010 |
| WO | WO 2010/107419 A1 | 9/2010 |
| WO | WO 2010/107466 A1 | 9/2010 |
| WO | WO 2010/130720 A2 | 11/2010 |
| WO | WO 2011/016498 A1 | 2/2011 |
| WO | WO 2011/023902 A2 | 3/2011 |
| WO | WO 2011/029758 A1 | 3/2011 |

A - A

B - B

PHOTOVOLTAIC MODULE GROUND MOUNT

CLAIM OF PRIORITY

This application is a continuation of U.S. patent application Ser. No. 12/794,307, now U.S. Pat. No. 8,667,748, filed Jun. 4, 2010, which claims priority to U.S. Provisional Patent Application No. 61/184,618, filed on Jun. 5, 2009, the disclosures of which are incorporated by reference in their entirety.

TECHNICAL FIELD

This invention relates to a photovoltaic module ground mounting system with a collapsible photovoltaic module mounting assembly framework.

BACKGROUND

Photovoltaic modules can be mounted in an array. However, photovoltaic module arrays can be large and heavy and difficult to transport. Thus, they can be expensive and inefficient to transport.

DESCRIPTION OF DRAWINGS

FIG. 13A is a cross-section view taken along line 13A-13A in FIG. 13.

DETAILED DESCRIPTION

Figure 1:
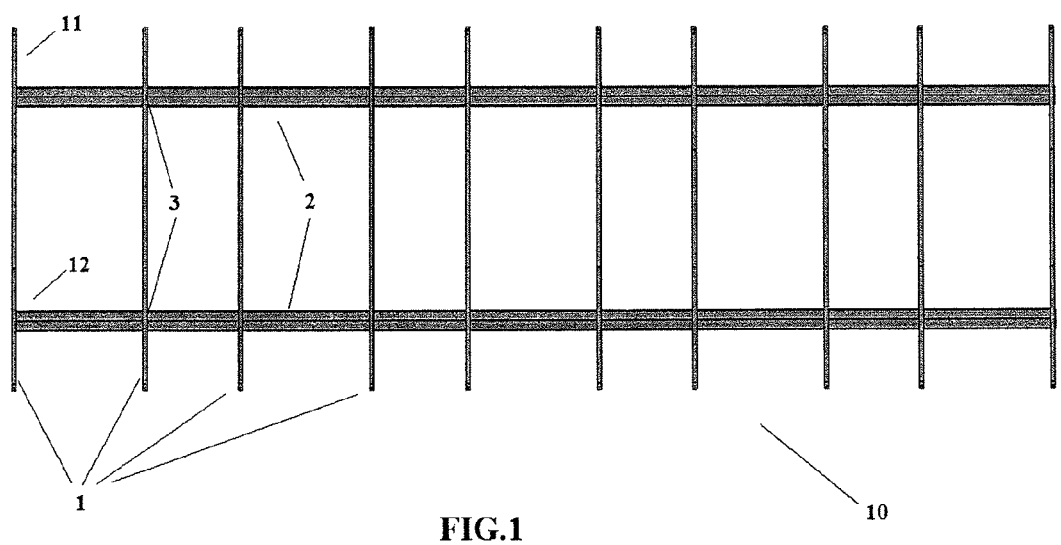
FIG. 1 is a view of a collapsible photovoltaic module mounting assembly framework.

Photovoltaic modules can be installed in an array using a mounting assembly framework installed adjacent to a surface such as the ground or a rooftop. A preassembled framework can save field labor and installation costs. A preassembled and collapsible photovoltaic module mounting assembly framework is developed as a part of a photovoltaic module ground mounting system. Since it is collapsible, the shipping volume can be reduced to maximize the transportation efficiency. After it is distributed onsite, it can be easily unracked and installed.

A photovoltaic module is a device that converts sunlight directly into electricity by the photovoltaic effect. Assemblies of modules are used to make photovoltaic arrays. Photovoltaic panels are normally made of silicon or thin-film cells. Many currently available solar cells are configured as bulk materials that are subsequently cut into wafers and treated in a "top-down" method of synthesis (silicon being the most prevalent bulk material). Other materials are configured as thin-films (inorganic layers, organic dyes, and organic polymers) that are deposited on supporting substrates. Cadmium telluride solar cell is a solar cell based on cadmium telluride, an efficient light-absorbing material for thin-film cells. Compared to other thin-film materials, CdTe is easier to deposit and more suitable for large-scale production. The photovoltaic module mounting assembly framework can be used to support both silicon and thin-film photovoltaic modules including cadmium telluride solar module.

In one aspect, a collapsible photovoltaic module mounting assembly framework can include two substantially parallel supporting beams, at least two substantially parallel photovoltaic module rails each configured to secure a portion of a photovoltaic module, wherein each of the module rails is connected to one of the supporting beams at a position on the rail proximate to the first end of the rail and connected to the other of the supporting beams at a position on the rail proximate to the second end of the rail, wherein the supporting beams can be moved to a relative position adjacent to each other by moving the module rails from a first orientation substantially perpendicular to the supporting beams to a second orientation substantially oblique to the supporting beams. The supporting beams can include steel. The supporting beams can include aluminum. The photovoltaic module rails can include steel. The photovoltaic module rails can include aluminum. The photovoltaic module mounting assembly framework can be configured to position an array of a plurality of photovoltaic modules in a plurality of rows and columns. The photovoltaic module mounting assembly framework can be configured to position an array of 15 photovoltaic modules in a configuration comprising 3 rows of modules and 5 columns of modules. The collapsible photovoltaic module mounting assembly framework can further include a lock that locks the module rails in an orientation substantially perpendicular to the supporting beams. The lock can unlock to allow the module rails to be moved to an orientation substantially oblique to the supporting beams.

In one aspect, a photovoltaic module ground mounting system can include a supporting column including an upper end, wherein the supporting column can be installed perpendicular to a surface, a bracket adjacent to the upper end of the supporting column, a collapsible photovoltaic module mounting assembly framework configured to be mounted adjacent to the bracket, the module mounting assembly framework including two substantially parallel supporting beams, at least two substantially parallel photovoltaic module rails each configured to secure a portion of a photovoltaic module, wherein each of the module rails is connected to one of the supporting beams at a position on the rail proximate to the first end of the rail and connected to the other of the supporting beams at a position on the rail proximate to the second end of the rail, wherein the supporting beams can be moved to a relative position adjacent to each other by moving the module rails from a first orientation substantially perpendicular to the supporting beams to a second orientation substantially oblique to the supporting beams. The supporting beams can include steel. The supporting beams can include aluminum. The photovoltaic module rails can include steel. The photovoltaic module rails can include aluminum. The photovoltaic module mounting assembly framework can be configured to position an array of a plurality of photovoltaic modules in a plurality of rows and columns. The photovoltaic module mounting assembly framework can be configured to position an array of 15 photovoltaic modules in a configuration comprising 3 rows of modules and 5 columns of modules. The supporting column can include steel. The supporting column can include aluminum. The bracket can include steel. The bracket can include aluminum. The bracket can be positioned to provide a module mounting position tilted with respect to the plane of a surface adjacent to which the supporting column can be installed. The photovoltaic module ground mounting system can further include a shipping cradle configured to conform to and encase the module mounting assembly framework in the collapsed position.

In one aspect, a method of installing a photovoltaic module mounting system can include the steps of positioning a supporting column including a bracket adjacent to a surface, wherein the bracket is adjacent to the upper end of the supporting column, attaching a collapsible photovoltaic module mounting assembly framework to the bracket, wherein the collapsible photovoltaic module mounting assembly framework can include two substantially parallel supporting beams, two substantially parallel supporting beams, at least two substantially parallel photovoltaic module rails each configured to secure a portion of a photovoltaic module, wherein each of the module rails is connected to one of the supporting beams at a position on the rail proximate to the first end of the rail and connected to the other of the supporting beams at a position on the rail proximate to the second end of the rail, wherein the supporting beams can be moved to a relative position adjacent to each other by moving the module rails from a first orientation substantially perpendicular to the supporting beams to a second orientation substantially oblique to the supporting beams, and mounting a photovoltaic module to the collapsible photovoltaic module mounting framework assembly. The supporting beam can include steel. The method can further include the step of attaching a photovoltaic module to a photovoltaic module rail of the module mounting assembly framework. The method can further include the step of adjusting the bracket to provide a module mounting position tilted compared to the surface.

Referring to FIG. 1, collapsible photovoltaic module mounting assembly framework 10 can include two supporting beams 2 and plurality of photovoltaic module rails 1. Supporting beams 2 can be substantially parallel. Photovoltaic module rails 1 can be substantially parallel to each other and can be substantially perpendicular to supporting beams 2. Module rail 1 can have first end portion 11 and second end portion 12. First end portion 11 of each of the module rails 1 can be pivotally connected to a supporting beam 2 by a hardware connector 3 (e.g., a rivet or any suitable connector). Second end portion 12 of each of the module rails 1 can be pivotally connected to the other supporting beam 2 by a hardware connector 3 (e.g., a rivet or any suitable connector).

Photovoltaic module mounting assembly framework 10 can position a plurality of photovoltaic modules in an array. The photovoltaic modules can be positioned by attaching a portion of each module to a module rail 1. Module rail 1 can be attached to any suitable portion of the photovoltaic module. For example, module rail 1 can be attached to an edge portion of a photovoltaic module. Module rail 1 can form a portion of a framework framing a portion of a photovoltaic module. Multiple module rails 1 can frame a photovoltaic module by framing multiple portions of a photovoltaic module. A module rail 1 can be attached to portions of multiple photovoltaic modules. For example, a single module rail 1 can be positioned between two edges of two photovoltaic modules.

Module rails 1 and supporting beams 2 can include any suitable material. For example module rails 1 and supporting beams 2 can include metal, such as steel or aluminum, or any other suitable metal. The module rails 1 and supporting beams 2 can be manufactured by any suitable technique including any suitable metalworking technique such as casting, forging, or roll forming.

As shown in FIG. 2a through FIG. 2c, photovoltaic module mounting assembly framework 10 can be deployed in an installation configuration, a collapsed configuration, and configurations in between. As shown in FIG. 2a, photovoltaic module mounting assembly framework 10 can be in an installation configuration where module rails 1 are substantially perpendicular to supporting beams 2. In this configuration, photovoltaic modules can be fitted and attached to framework 10. For example, photovoltaic modules can be attached to module rails 1. Multiple photovoltaic modules can be installed in one or more rows and/or columns for form a photovoltaic array. Photovoltaic module mounting assembly framework 10 can include a lock to lock framework 10 in the installation configuration. When locked, module rails 1 and supporting beams 2 are held substantially perpendicular to each other. The lock can automatically lock framework 10 when framework 10 is changed from collapsed configuration to installation configuration. As shown in FIGS. 2b and 2c, photovoltaic module mounting assembly framework 10 can be collapsed by unlocking (if locked) and moving supporting beams 2 relative to each other so that they are adjacent to one another. The process of moving supporting beams 2 adjacent to each other can include moving module rails 1 from a first orientation substantially perpendicular to supporting beams 2 to a second position substantially oblique to supporting beams 2. By comparing FIG. 2a (mounting assembly framework 10 in installation configuration) to FIG. 2c (mounting assembly framework 10 in a fully folded configuration), reduction of volume can be seen.

Figure 2:
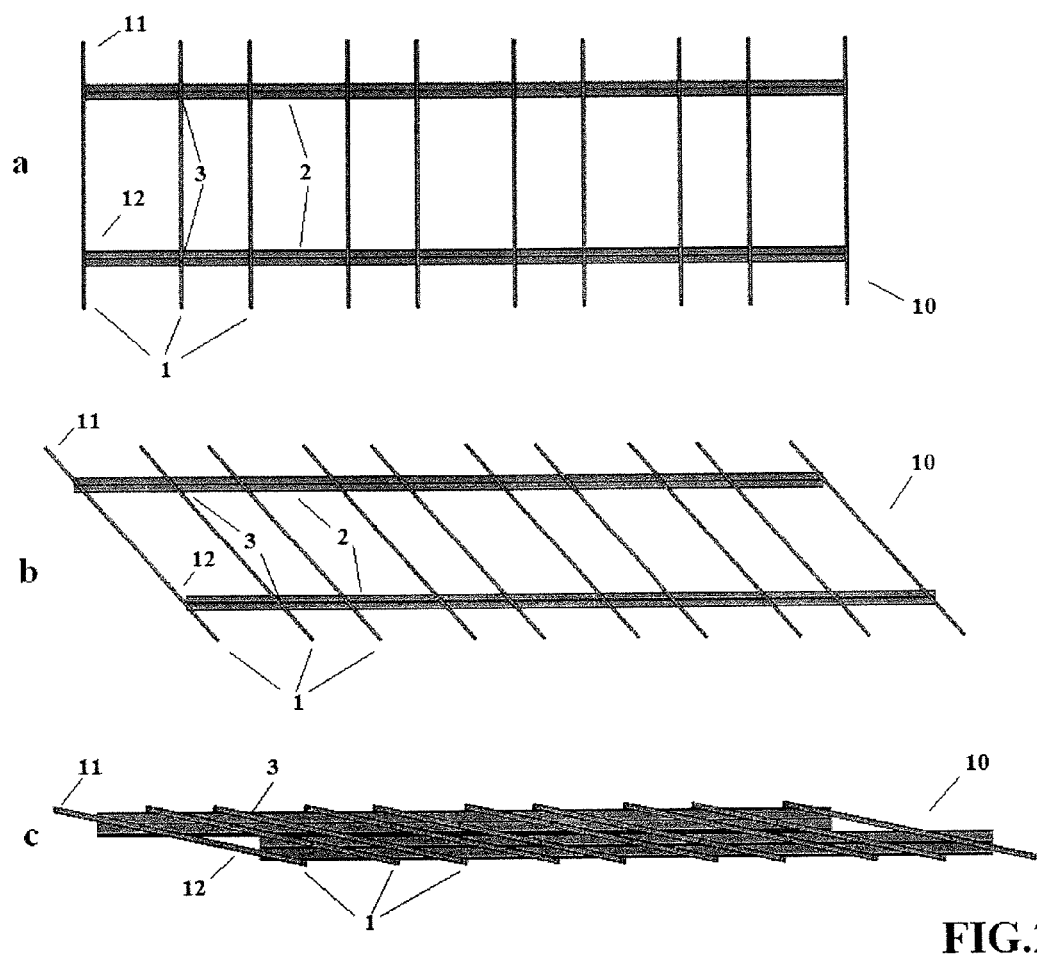
FIG. 2 illustrates the folding steps of the collapsible photovoltaic module mounting assembly framework.
Figure 3:
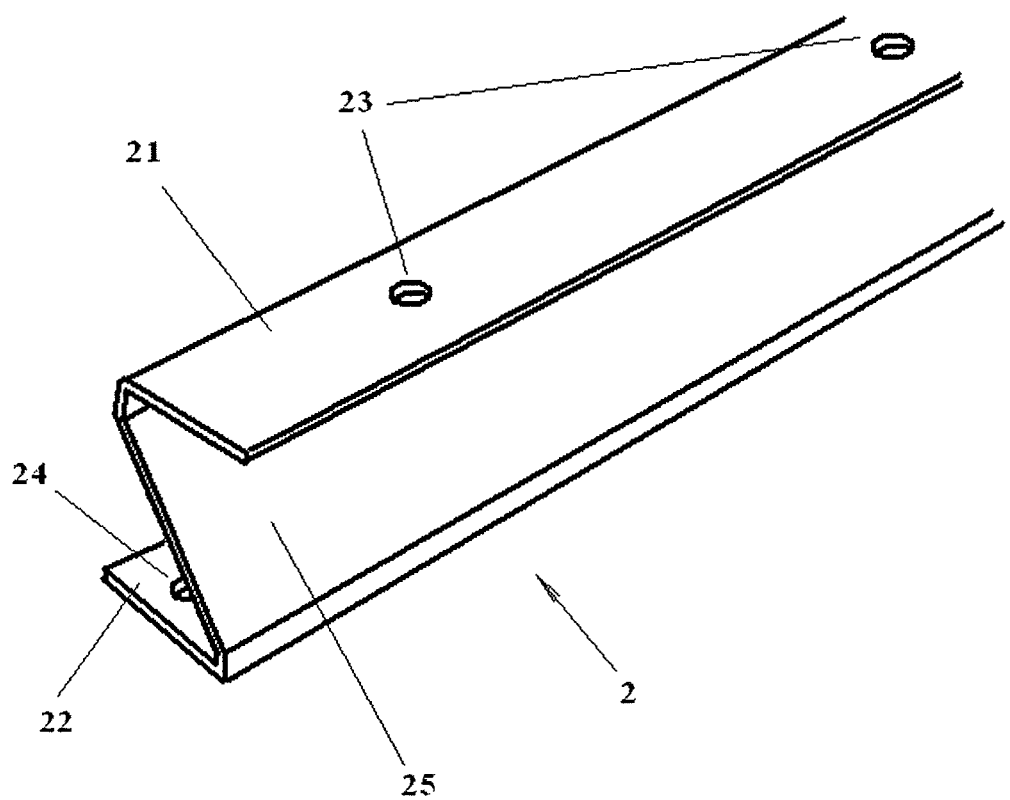
FIG. 3 is a partial perspective view of an embodiment of a supporting beam of the collapsible photovoltaic module mounting assembly framework.

Referring to FIG. 3 as a part of supporting beam 2 of the collapsible photovoltaic module mounting assembly framework (10 in FIG. 1 and FIG. 2), supporting beam 2 may have a substantially Z-shaped profile and can include tilted support portion 25. Top panel 21 is attached to the top of support portion 25 and has at least one opening 23 to pivotally connect with the photovoltaic module rail 1. A bottom panel 22 is attached to the bottom of the support portion 25 and has at least one opening 24 to accommodate a hardware connector (e.g., a screw, nail, rivet, weld, adhesive, or braze joint) which can be used to secure the assembly framework 10 to other supporting part of mounting system. Supporting beams 2 may be formed of extruded aluminum or steel.

Figure 4:
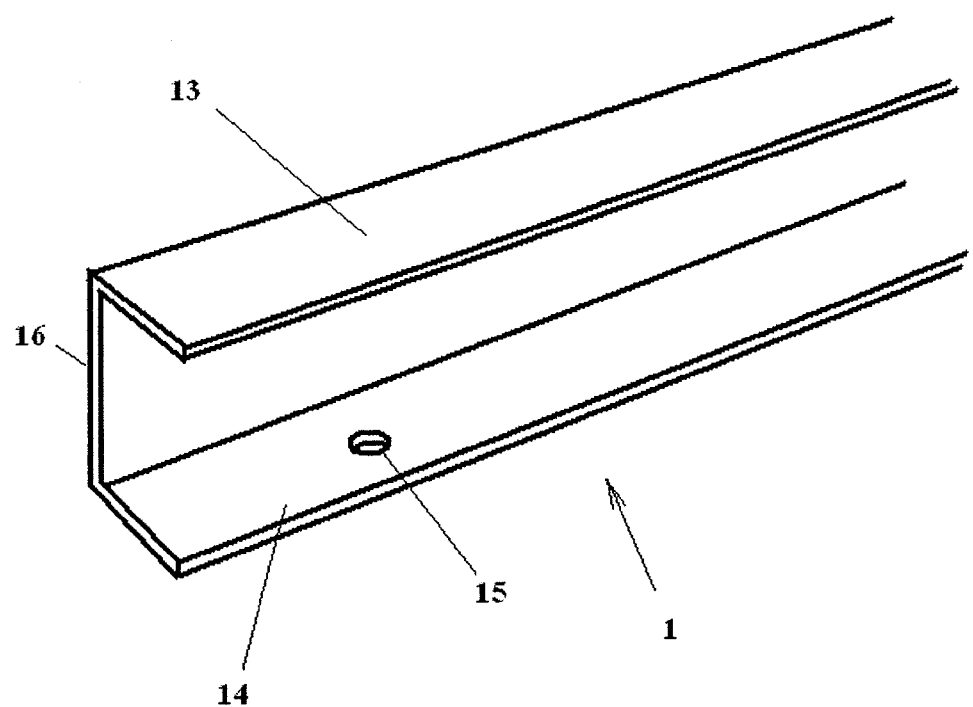
FIG. 4 is a partial perspective view of an embodiment of a module rail of the collapsible photovoltaic module mounting assembly framework.

Referring to FIG. 4 as a part of photovoltaic module rail 1 of the collapsible photovoltaic module mounting assembly framework (10 in FIG. 1 and FIG. 2), module rail 1 may include support portion 16. Top panel 13 is attached to the top of support portion 16 and can be adjacent to a clip, bracket, or any suitable means for securing a photovoltaic module. Bottom panel 14 is attached to the bottom of the support portion 16 and has at least one opening 15 to pivotally connect with supporting beam 2 of the collapsible photovoltaic module mounting framework assembly. Photovoltaic module rail 1 may be formed of extruded aluminum or steel.

Figure 5:
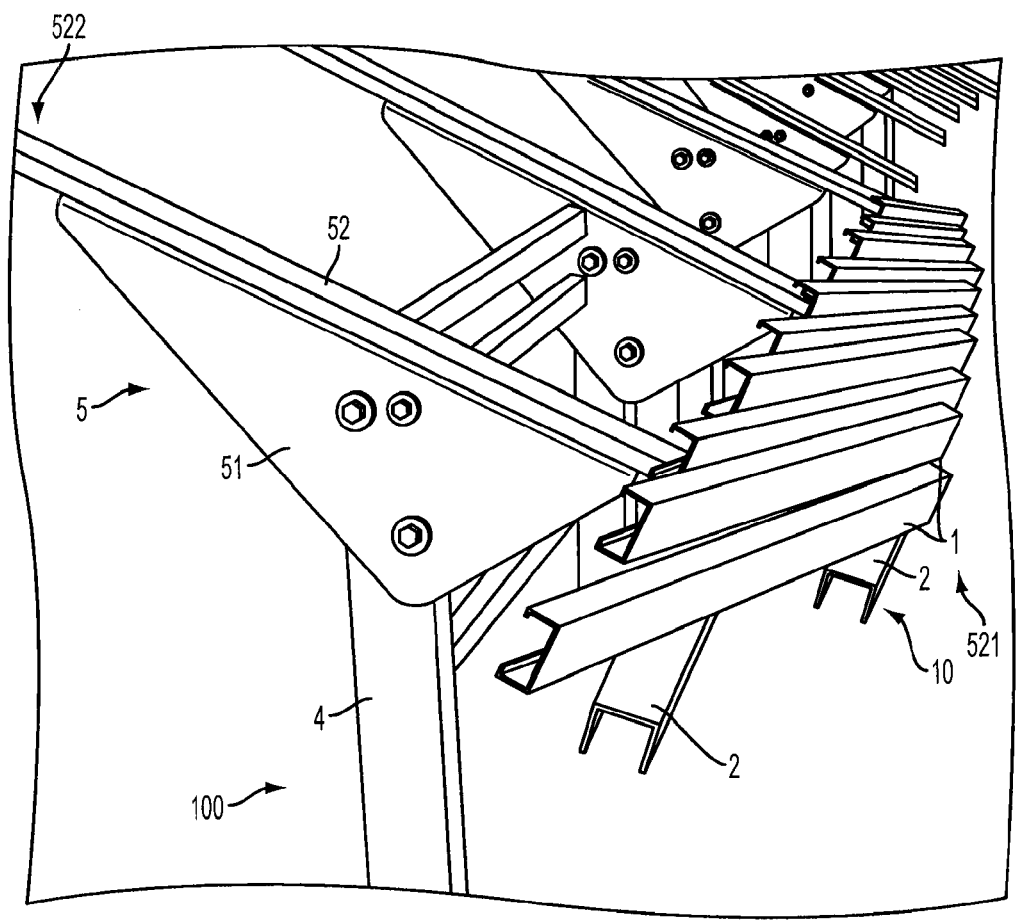
FIG. 5 is a partial perspective view of a photovoltaic module ground mounting system with folded photovoltaic module assembly framework.

FIG. 5 shows photovoltaic module ground mounting system 100 with folded photovoltaic module mounting framework assembly 10. Photovoltaic module ground mounting system 100 may include supporting columns 4 and tilt brackets 5. Supporting column 4 can be configured to be installed adjacent to a surface such as the ground or a rooftop or any other suitable surface. Supporting column 4 can include an upper end configured to be attached to tilt bracket 5. Tilt bracket 5 can include lower supporting portion 51 and tilted upper mounting portion 52. Lower supporting portion 51 can be attached to the upper end of supporting column 4. Lower end 521 of tilted upper mounting portion 52 can be attached to one of two supporting beams 2 of collapsible photovoltaic module mounting assembly framework 10. The attachment can be done with a hardware connector (e.g., a bolt, screw, nail, rivet, weld, adhesive, or braze joint).

Support column 4 and tilt bracket 5 can include any suitable material. For example, support column 4 and tilt bracket 5 can include metal, such as steel or aluminum, or any other suitable metal. Support column 4 and tilt bracket 5 can be manufactured by any suitable technique including any suitable metalworking technique such as casting, forging, or roll forming.

Figure 6:
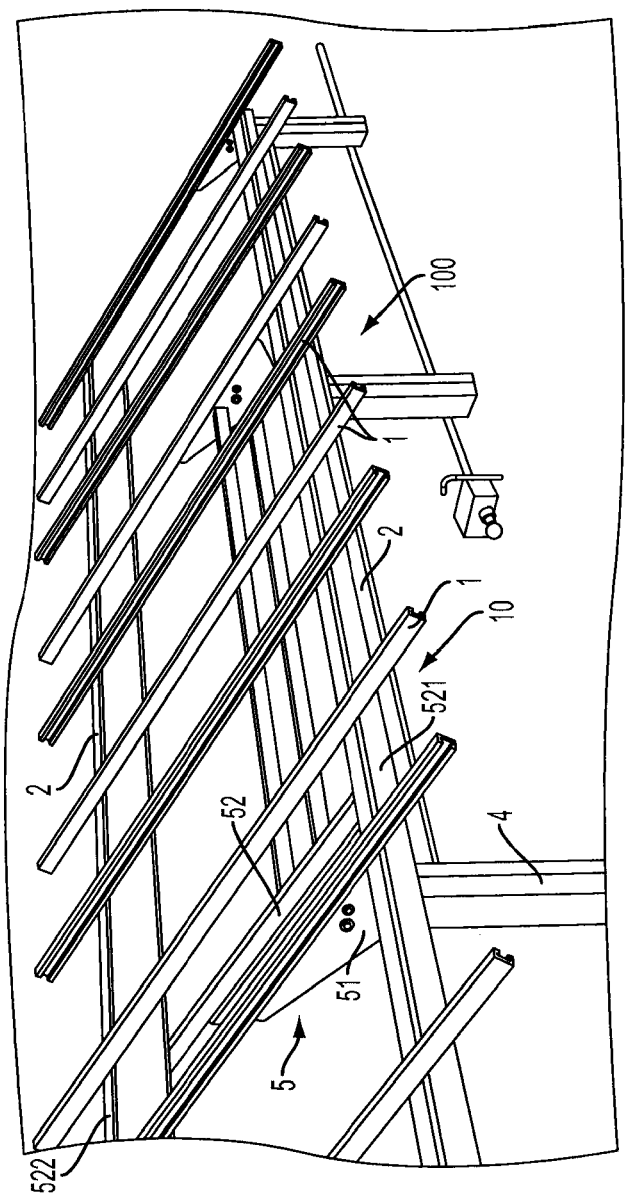
FIG. 6 is a partial perspective view of a photovoltaic module ground mounting system with expanded photovoltaic module assembly framework.

Referring to FIG. 6 as a part of photovoltaic module ground mounting system 100 with expanded photovoltaic module mounting assembly framework 10, including lower end 521 of tilted upper mounting portion 52 attached to one of two supporting beams 2 of collapsible photovoltaic module mounting framework assembly 10 and mounting assembly framework 10 is fully unfolded, upper end 522 of tilted upper mounting portion 52 can be attached to the other one of two supporting beams 2 to secure collapsible photovoltaic module mounting assembly framework 10 on tilt brackets 5. The attachment can be done with a hardware connector (e.g., a bolt, screw, nail, rivet, weld, adhesive, or braze joint). Supporting columns 4 can include extruded aluminum or steel. Tilt brackets 5 can include extruded aluminum or steel. Photovoltaic module mounting assembly framework 10 can designed and deployed to install any a photovoltaic module array of any suitable desired size. For example, photovoltaic module mounting assembly framework can support 15 photovoltaic modules, 3 modules high by 5 modules wide. The tilt bracket 5 may be adjustable such that the degree of tilt of bracket 5 can be adjusted to optimize the orientation of tilt bracket 5 with respect to the sun. The photovoltaic module ground mounting system 100 can include a shipping cradle for protecting the racked photovoltaic module mounting assembly framework 10.

Based on the design showed in FIG. 1 and FIG. 2, the photovoltaic module mounting assembly framework can be used with different configurations to mount different size photovoltaic modules, such as 2 feet×4 feet cadmium telluride solar module. Photovoltaic module mounting assembly framework 10 can also be customized to support different size photovoltaic modules. Photovoltaic module mounting assembly framework 10 can also support photovoltaic modules with dimensions of 1 ft×2 ft, 1 ft×1 ft, 2 ft×2 ft, 2 ft×3 ft, 3 ft×3 ft, 3 ft×4 ft, 4 ft×4 ft, or any other available photovoltaic module dimensions.

Figure 7:
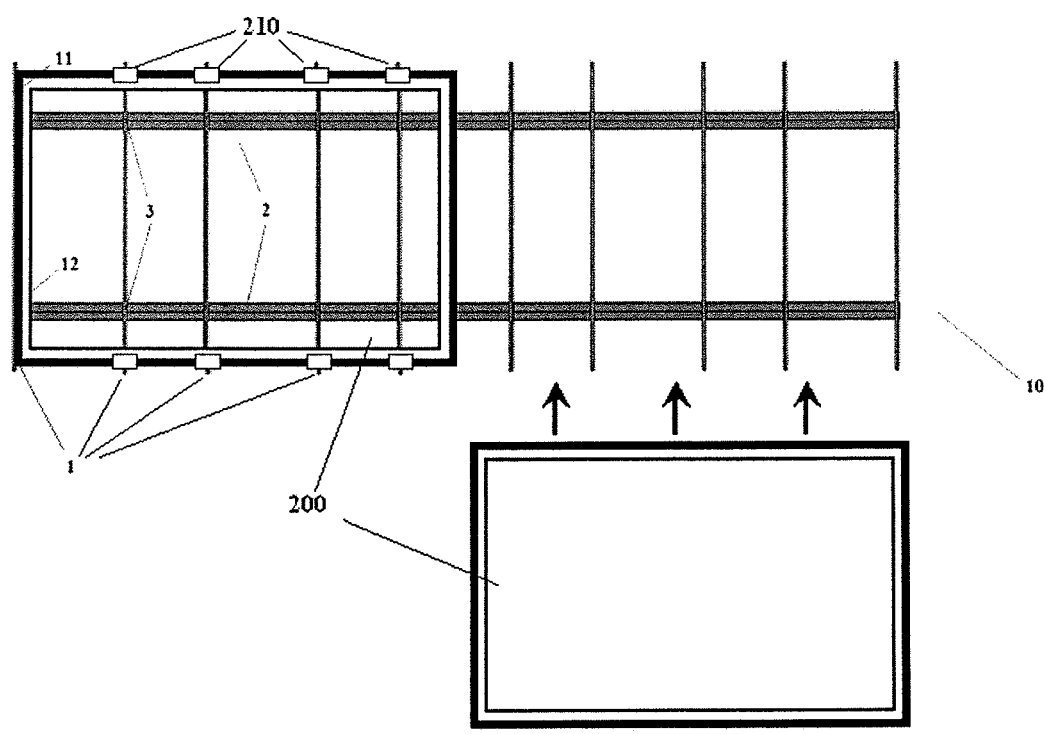
FIG. 7 illustrates a configuration of the collapsible photovoltaic module mounting assembly framework with photovoltaic modules.
Figure 8:
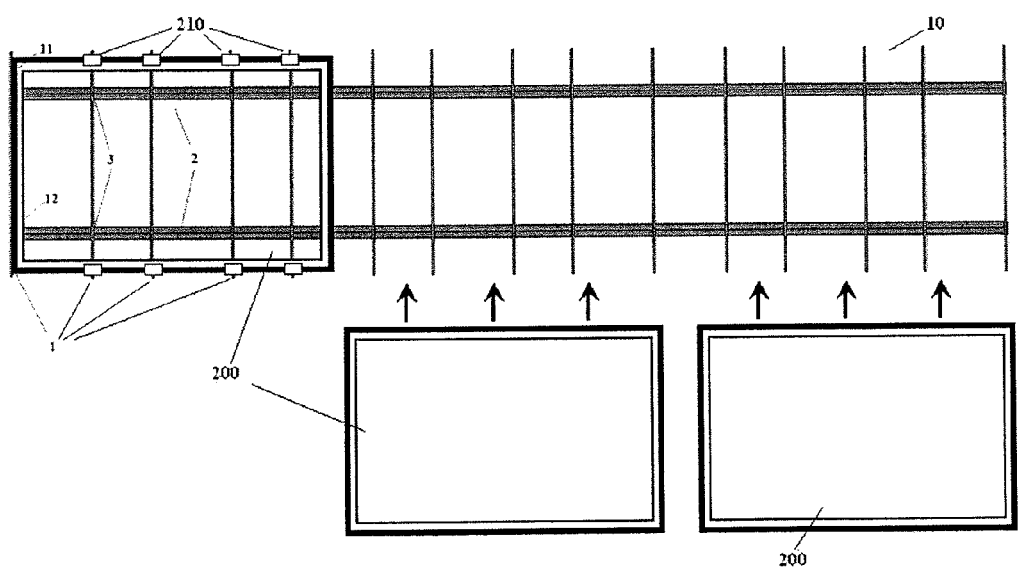
FIG. 8 illustrates a configuration of the collapsible photovoltaic module mounting assembly framework with photovoltaic modules.
Figure 9:
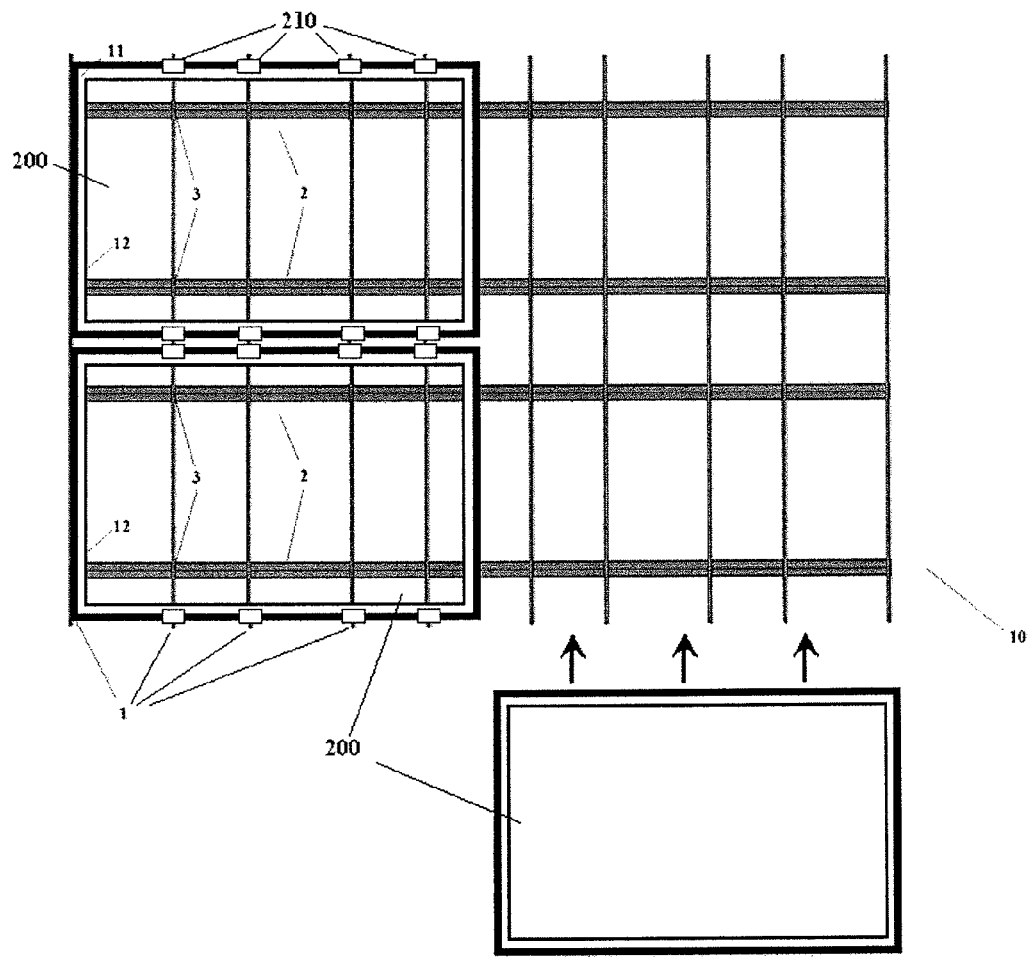
FIG. 9 illustrates a configuration of the collapsible photovoltaic module mounting assembly framework with photovoltaic modules.

Additionally, the photovoltaic module mounting assembly framework can be configured to position an array of a plurality of photovoltaic modules in a plurality of rows and columns. FIG. 7, FIG. 8, and FIG. 9 illustrate different configurations of the collapsible photovoltaic module mounting assembly framework with photovoltaic modules. Referring to FIG. 7, photovoltaic module mounting assembly framework 10 can support two photovoltaic modules, 1 module high by 2 modules wide (1×2). Photovoltaic module 200 can be mounted on module rail 1 with mounting clip 210 or any suitable mounting means (e.g., a mounting bracket, adhesive, or braze joint). Referring to FIG. 8, photovoltaic module mounting assembly framework 10 can support three photovoltaic modules, 1 module high by 3 modules wide (1×3). Referring to FIG. 9, photovoltaic module mounting assembly framework 10 can support four photovoltaic modules, 2 modules high by 2 modules wide (2×2).

Figure 10:
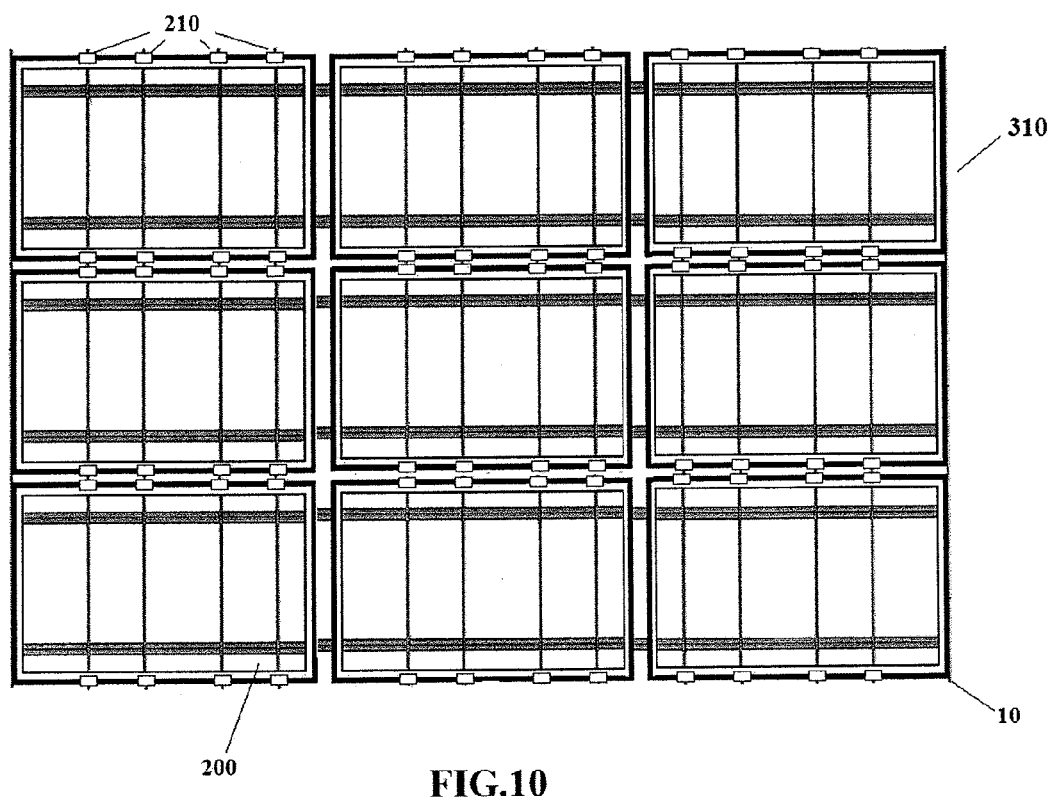
FIG. 10 illustrates a 3×3 photovoltaic array supported by the collapsible photovoltaic module mounting assembly framework.
Figure 11:
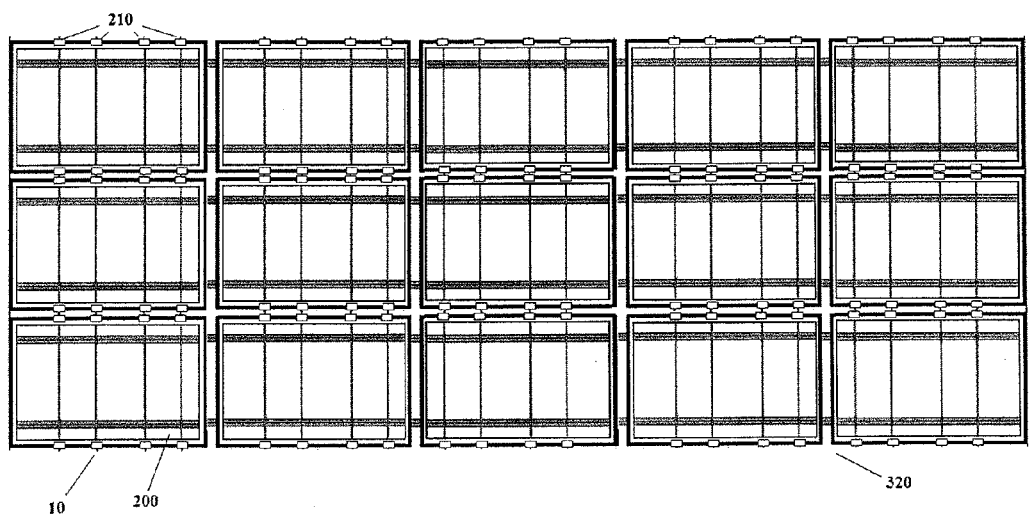
FIG. 11 illustrates a 3×5 photovoltaic array supported by the collapsible photovoltaic module mounting assembly framework.
Figure 12:
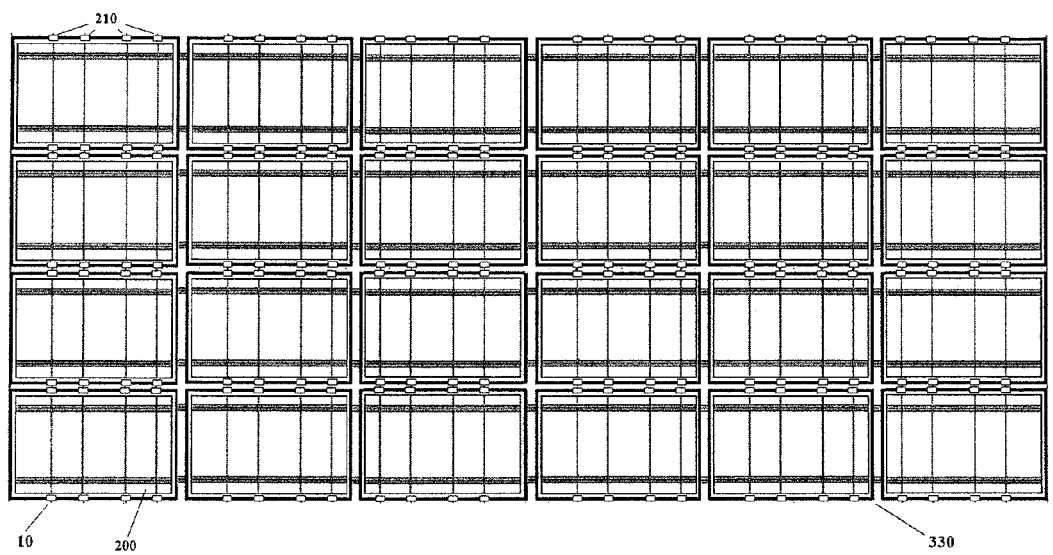
FIG. 12 illustrates a 4×6 photovoltaic array supported by the collapsible photovoltaic module mounting assembly framework.

Furthermore, photovoltaic arrays of different dimensions can be supported by the collapsible photovoltaic module mounting assembly framework. FIG. 10, FIG. 11, and FIG. 12 illustrate photovoltaic arrays supported by the collapsible photovoltaic module mounting assembly framework. FIG. 10 illustrates photovoltaic array 310 supported by collapsible photovoltaic module mounting assembly framework 10. Photovoltaic array 310 can include 9 photovoltaic modules, 3 modules high by 3 modules wide (3×3). Photovoltaic module 200 of photovoltaic array 310 can be mounted on assembly framework 10 with mounting clip 210 or any suitable mounting means (e.g., a mounting bracket, adhesive, or braze joint). FIG. 11 illustrates photovoltaic array 320 supported by collapsible photovoltaic module mounting assembly framework 10. Photovoltaic array 320 can include 15 photovoltaic modules, 3 modules high by 5 modules wide (3×5). FIG. 12 illustrates photovoltaic array 330 supported by collapsible photovoltaic module mounting assembly framework 10. Photovoltaic array 330 can include 24 photovoltaic modules, 4 modules high by 6 modules wide (4×6). Photovoltaic module mounting assembly framework 10 can also support photovoltaic arrays with configurations of 1×4, 1×5, 1×6, 2×3, 2×4, 2×5, 2×6, 3×2, 3×4, 3×5, 3×6, 4×2, 4×3, 4×4, 4×5, 5×2, 5×3, 5×4, 5×5, 5×6, 6×2, 6×3, 6×4, 6×5, or 6×6 photovoltaic modules. The length and width of the photovoltaic array supported by collapsible photovoltaic module mounting assembly framework 10 can range from about 1 foot to about 35 feet.

Figure 13:
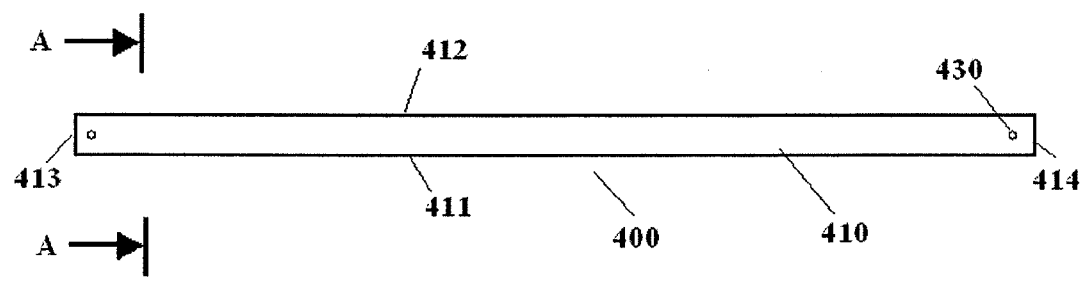
FIG. 13 is a top view of an embodiment of a supporting beam of the collapsible photovoltaic module mounting assembly framework.
Figure 13:
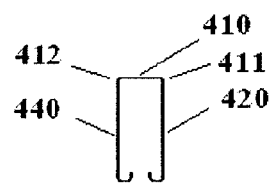

Referring to FIG. 13, a top view of supporting beam 400 of the collapsible photovoltaic module mounting assembly framework is depicted. Rail 400 includes rectangular top plate 410 having first end 413, second end 414, first side edge 411, second side edge 412. Supporting beam 400 can also include openings 430 which can be configured to accommodate a hardware connector (e.g., a screw, nail, rivet, weld, adhesive, or braze joint) used to connect beam 400 to tilt brackets (5 in FIG. 15 or 6 in FIG. 16) or module rail. Openings 430 can also be used to attach module rail (1 in FIG. 5 or 600 in FIG. 15) to supporting beam 400. Referring to FIG. 13A, an end view of beam 400 is shown. First J-shaped side wall 420 extends downward, perpendicular from first side edge 411 of top plate 410. Second J-shaped side wall 440 extends downward, perpendicular from second side edge 412 of top plate 410. The resulting cross-section can be top hat-shaped. Supporting beam 400 can be formed from any suitable material, including metal such as aluminum or galvanized steel.

Figure 14:
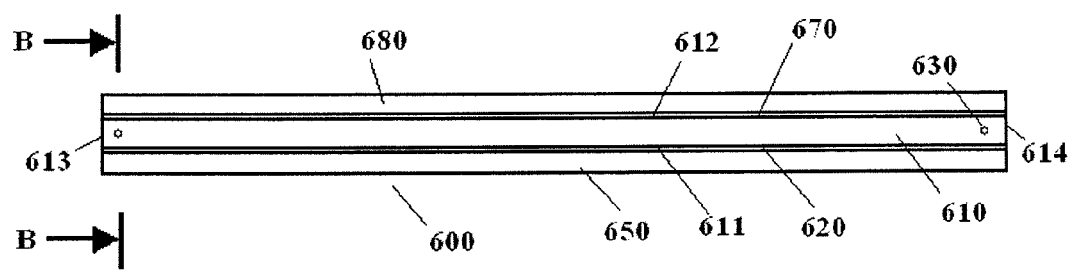
FIG. 14 is a top view of an embodiment of a module rail of the collapsible photovoltaic module mounting assembly framework.
Figure 14A:
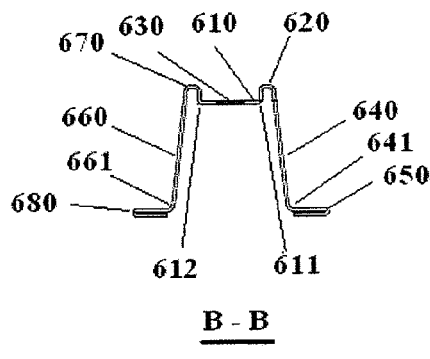
FIG. 14A is a cross-section view taken along line 14B-14B in FIG. 14.

Referring to FIG. 14, a top view of module rail 600 is depicted. Module rail 600 includes rectangular top plate 610 having first end 613, second end 614, first side edge 611, second side edge 612, first mounting structure 620, second mounting structure 670, first base plate 650, and second base plate 680. Module rail 600 can also include openings 630 which can be configured to accommodate a hardware connector (e.g., a screw, nail, rivet, weld, adhesive, or braze joint) used to connect rail 600 to a supporting beam (2 in FIG. 5 or 400 in FIG. 18). Openings 630 can also be provided to attach photovoltaic module (200 in FIG. 18) to rail 600. Referring to FIG. 14A an end view of rail 600 is shown. First mounting structure 620 can be a bump-like structure to contact or secure photovoltaic modules. First mounting structure 620 can be adjacent to first side edge 611 of top plate 610. First side wall 640 extends downward, perpendicular from first mounting structure 620 adjacent to top plate 610, ending at first terminal edge 641. First base plate 650 can extend from first terminal edge 641 of first side wall 640. Second mounting structure 670 can be a bump-like structure to contact or secure photovoltaic modules. Second mounting structure 670 can be adjacent to second side edge 612 of top plate 610. Second side wall 660 extends downward, perpendicular from second mounting structure 670 adjacent to top plate 610, ending at second terminal edge 661. Second base plate 680 can extend from second terminal edge 661 of second side wall 660. The resulting cross-section can be top hat-shaped. Rail 600 can be formed from any suitable material, including metal such as aluminum or galvanized steel.

Figure 15:
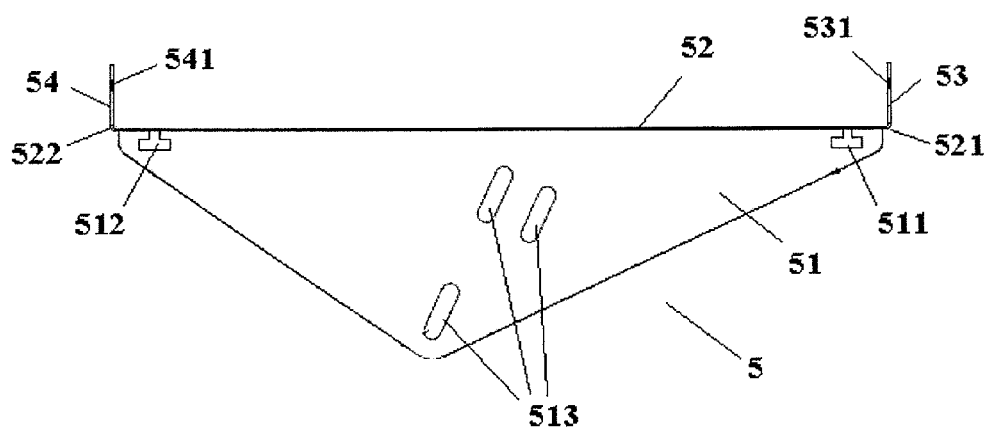
FIG. 15 is a view of an embodiment of a tilt bracket of the collapsible photovoltaic module mounting assembly framework.
Figure 15A:
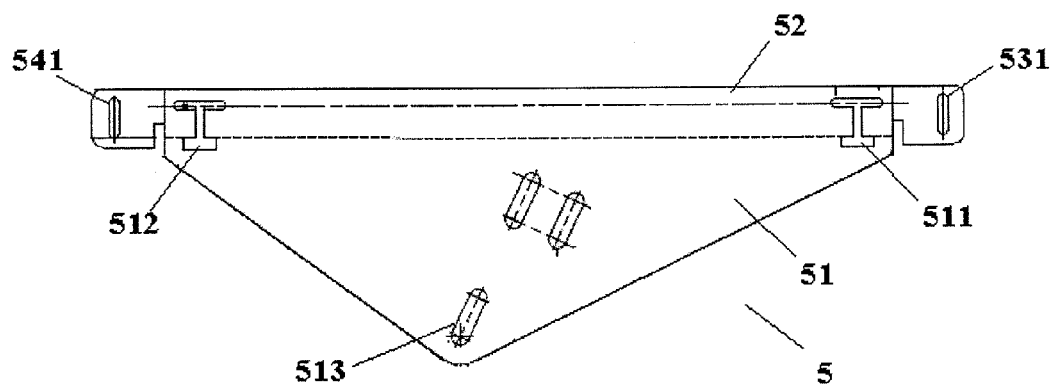
FIG. 15A is a plate layout view of the tilt bracket in FIG. 15.

Referring to FIG. 15, a view of tilt bracket 5 of the collapsible photovoltaic module mounting assembly framework is depicted. FIG. 15A is a plate layout view of tilt bracket 5 in FIG. 15. Tilt bracket 5 can include lower supporting portion 51 and tilted upper mounting portion 52. Lower supporting portion 51 can have an opening 513 which can be configured to accommodate a hardware connector (e.g., a screw, nail, rivet, weld, adhesive, or braze joint) used to attach to the upper end of supporting column (4 in FIG. 5 and FIG. 18). Tilt bracket 5 can have an opening 511 adjacent to lower end 521 of tilted upper mounting portion 52 which can be configured to accommodate a hardware connector (e.g., a screw, nail, rivet, weld, adhesive, or braze joint) used to attach to one of two supporting beams (2 in FIG. 3 or 400 in FIG. 13) of collapsible photovoltaic module mounting assembly framework. Tilt bracket 5 can also include an opening 512 adjacent to upper end 522 of tilted upper mounting portion 52 which can be configured to accommodate a hardware connector (e.g., a screw, nail, rivet, weld, adhesive, or braze joint) used to attach to one of two supporting beams (2 in FIG. 3 or 400 in FIG. 13) of collapsible photovoltaic module mounting assembly framework. Tilt bracket 5 can have rail connector 53 extending upward, perpendicular from lower end 521 of tilted upper mounting portion 52. Rail connector 53 can include an opening 531 which can be configured to accommodate a hardware connector (e.g., a screw, nail, rivet, weld, adhesive, or braze joint) used to attach to one of two module rails (1 in FIG. 4 or 600 in FIG. 14) of collapsible photovoltaic module mounting assembly framework. Opening 531 can also be configured to accommodate a hardware connector (e.g., a screw, nail, rivet, weld, adhesive, or braze joint) used to secure one of two supporting beams (2 in FIG. 3 or 400 in FIG. 13). Tilt bracket 5 can also include rail connector 54 extending upward, perpendicular from upper end 522 of tilted upper mounting portion 52. Rail connector 54 can include an opening 541 which can be configured to accommodate a hardware connector (e.g., a screw, nail, rivet, weld, adhesive, or braze joint) used to attach to one of two module rails (1 in FIG. 4 or 600 in FIG. 14) of collapsible photovoltaic module mounting assembly framework. Opening 541 can also be configured to accommodate a hardware connector (e.g., a screw, nail, rivet, weld, adhesive, or braze joint) used to secure one of two supporting beams (2 in FIG. 3 or 400 in FIG. 13).

Figure 16:
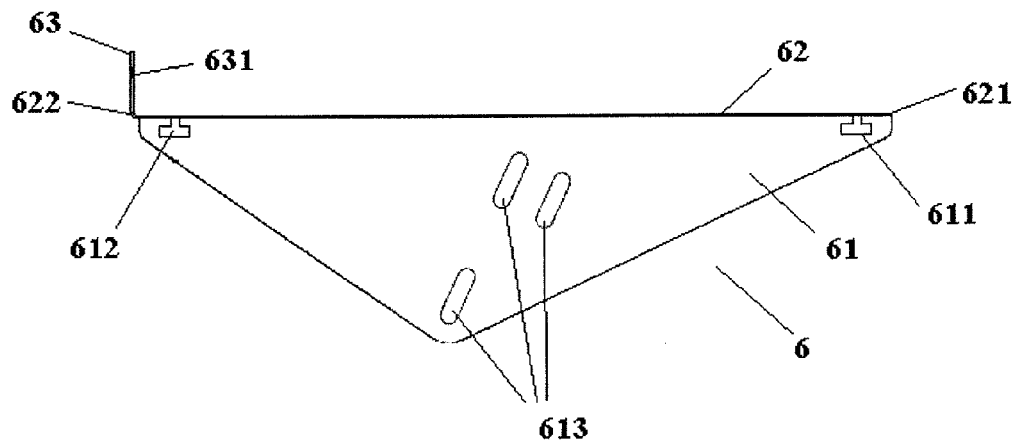
FIG. 16 is a view of an embodiment of a tilt bracket of the collapsible photovoltaic module mounting assembly framework.
Figure 16A:
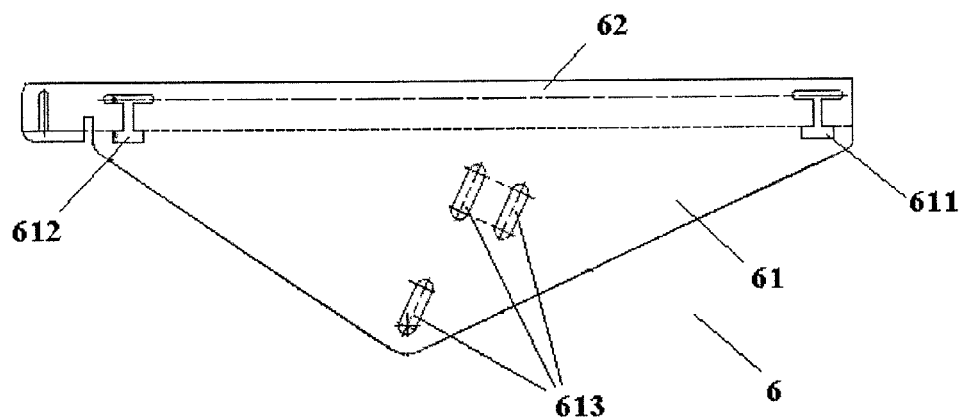
FIG. 16A is a plate layout view of the tilt bracket in FIG. 16.

Referring to FIG. 16, a view of tilt bracket 6 of the collapsible photovoltaic module mounting assembly framework is depicted. FIG. 16A is a plate layout view of tilt bracket 6 in FIG. 16. Tilt bracket 6 can include lower supporting portion 61 and tilted upper mounting portion 62. Lower supporting portion 61 can have an opening 613 which can be configured to accommodate a hardware connector (e.g., a screw, nail, rivet, weld, adhesive, or braze joint) used to attach to the upper end of supporting column (4 in FIG. 5 and FIG. 18). Tilt bracket 6 can have an opening 611 adjacent to first end 621 of tilted upper mounting portion 62 which can be configured to accommodate a hardware connector (e.g., a screw, nail, rivet, weld, adhesive, or braze joint) used to attach to one of two supporting beams (2 in FIG. 3 or 400 in FIG. 13) of collapsible photovoltaic module mounting assembly framework. Tilt bracket 6 can also include an opening 612 adjacent to second end 622 of tilted upper mounting portion 62 which can be configured to accommodate a hardware connector (e.g., a screw, nail, rivet, weld, adhesive, or braze joint) used to attach to one of two supporting beams (2 in FIG. 3 or 400 in FIG. 13) of collapsible photovoltaic module mounting assembly framework. Tilt bracket 6 can have rail stopper 63 extending upward, perpendicular from second end 622 of tilted upper mounting portion 62. Rail stopper 63 can include an opening 631 which can be configured to accommodate a hardware connector (e.g., a screw, nail, rivet, weld, adhesive, or braze joint) used to attach to one of two module rails (1 in FIG. 4 or 600 in FIG. 14) of collapsible photovoltaic module mounting assembly framework. Opening 631 can also be configured to accommodate a hardware connector (e.g., a screw, nail, rivet, weld, adhesive, or braze joint) used to secure one of two supporting beams (2 in FIG. 3 or 400 in FIG. 13). Tilt bracket 5 and 6 can include any suitable material. For example, tilt bracket 5 and 6 can include metal, such as steel or aluminum, or any other suitable metal. Tilt bracket 5 and 6 can be manufactured by any suitable technique including any suitable metalworking technique such as casting, forging, or roll forming.

Figure 17:
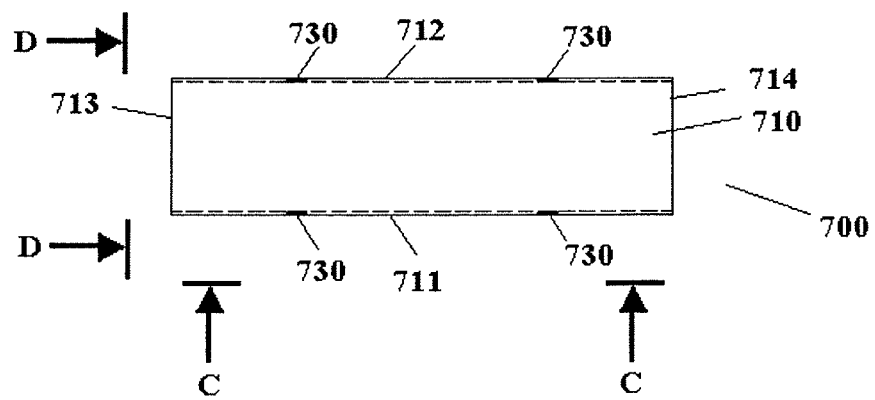
FIG. 17 is a top view of an embodiment of a supporting beam connector of the collapsible photovoltaic module mounting assembly framework.
Figure 17A:
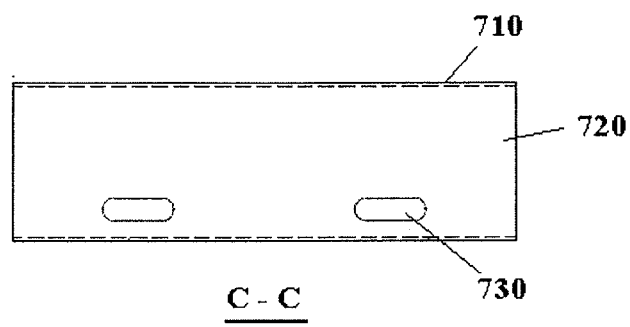
FIG. 17A is a side view taken along line 17C-17C in FIG. 17.
Figure 17B:
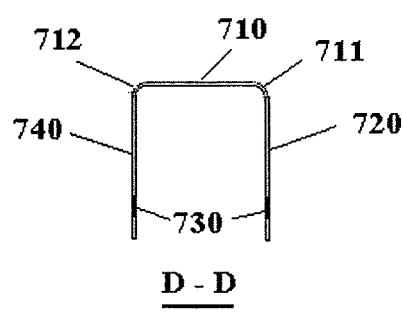
FIG. 17B is a cross-section view taken along line 17D-17D in FIG. 17.

Referring to FIG. 17, a top view of supporting beam connector 700 of the collapsible photovoltaic module mounting assembly framework is depicted. FIG. 17A is a side view of supporting beam connector 700. Beam connector 700 includes rectangular top plate 710 having first end 713, second end 714, first side edge 711, second side edge 712. Referring to FIG. 17B, an end view of beam connector 700 is shown. First side wall 720 extends downward, perpendicular from first side edge 711 of top plate 710. Second side wall 740 extends downward, perpendicular from second side edge 712 of top plate 710. The resulting cross-section can be top hat-shaped. Beam connector 700 can also include openings 730 on side wall 720 and 740 which can be configured to accommodate a hardware connector (e.g., a screw, nail, rivet, weld, adhesive, or braze joint) used to attach beam connector 700 to beam (400 in FIG. 13). Beam connector 700 can be formed from any suitable material, including metal such as aluminum or galvanized steel.

Figure 18:
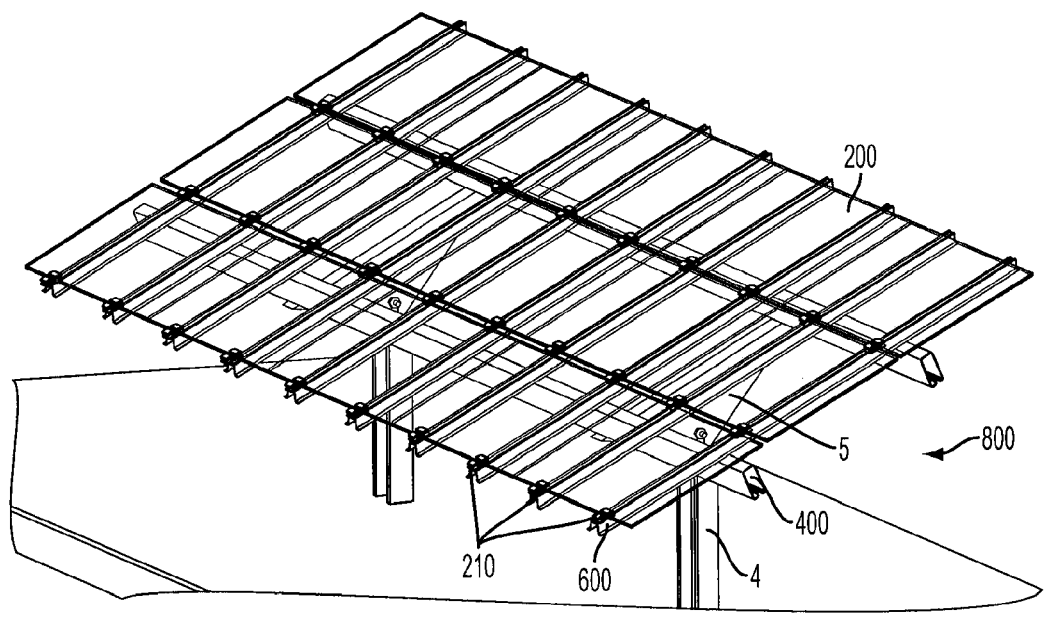
FIG. 18 illustrates a configuration of the collapsible photovoltaic module mounting assembly framework with photovoltaic modules.
Figure 19:
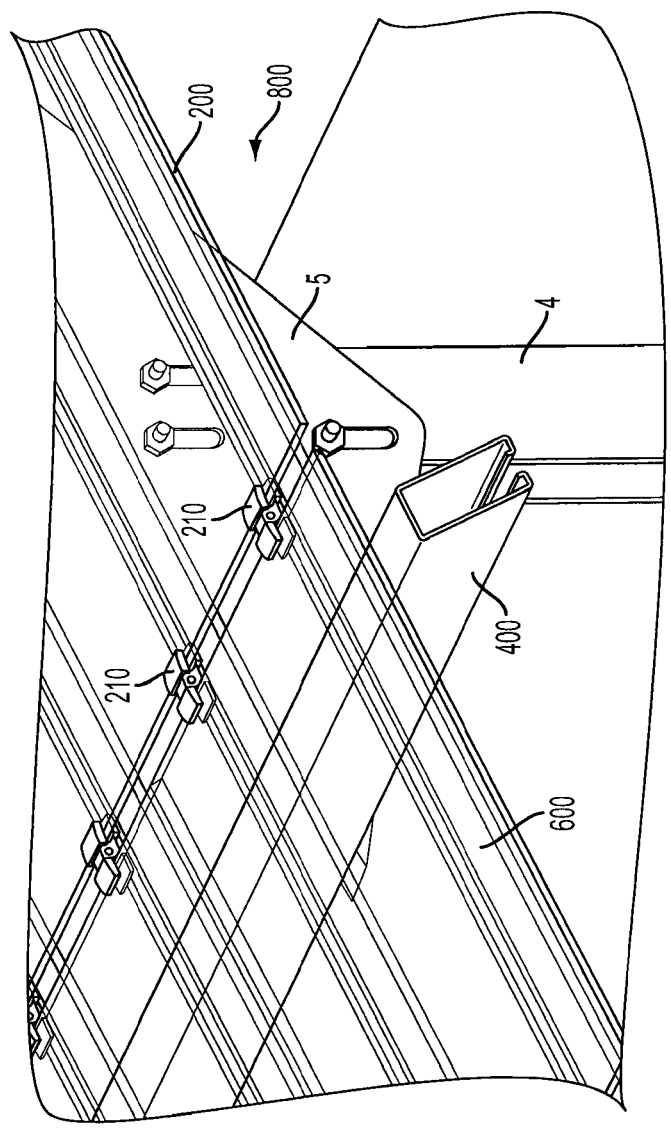
FIG. 19 is a close-in view of the configuration of the collapsible photovoltaic module mounting assembly framework with photovoltaic modules.

Based on the design showed in FIG. 13, FIG. 14, FIG. 15, FIG. 16, and FIG. 17, the photovoltaic module mounting assembly framework including supporting beam 400 and module rail 600 can be used with different configurations to mount different size photovoltaic modules, such as 2 feet×4 feet cadmium telluride solar module. Photovoltaic module mounting assembly framework can also be customized to support different size photovoltaic modules. Photovoltaic module mounting assembly framework 10 can also support photovoltaic modules with dimensions of 1 ft×2 ft, 1 ft×1 ft, 2 ft×2 ft, 2 ft×3 ft, 3 ft×3 ft, 3 ft×4 ft, 4 ft×4 ft, or any other available photovoltaic module dimensions. Referring to FIG. 18 and FIG. 19, photovoltaic module mounting assembly framework 800 can support 15 photovoltaic modules, 3 modules high by 5 modules wide (3×5). Photovoltaic module 200 can be mounted on module rail 600 with mounting clip 210 or any suitable mounting means (e.g., a mounting bracket, adhesive, or braze joint). Photovoltaic module mounting assembly framework 800 may include supporting columns 4 and tilt brackets 5. Supporting column 4 can be configured to be installed adjacent to a surface such as the ground or a rooftop or any other suitable surface. Photovoltaic module mounting assembly framework 800 can also support photovoltaic arrays with configurations of 1×2, 1×3, 1×4, 1×5, 1×6, 2×2, 2×3, 2×4, 2×5, 2×6, 3×2, 3×4, 3×6, 4×2, 4×3, 4×4, 4×5, 4×6, 5×2, 5×3, 5×4, 5×5, 5×6, 6×2, 6×3, 6×4, 6×5, or 6×6 photovoltaic modules. The length and width of the photovoltaic array supported by collapsible photovoltaic module mounting assembly framework 800 can range from about 1 foot to about 35 feet.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A collapsible photovoltaic module mounting assembly framework comprising:
   at least two substantially parallel supporting beams; and
   at least two substantially parallel photovoltaic module rails each configured to secure a portion of a photovoltaic module, each photovoltaic module rail having:
       a top plate having a first top surface and a first bottom surface opposite the first top surface, wherein the first bottom surface faces the at least two supporting beams;
       a mounting structure having a second top surface and a second bottom surface opposite the second top surface, wherein the second top surface is configured to contact a bottom surface of a photovoltaic module;
       a side edge extending upward from the first top surface to the second bottom surface, adjacent to the top plate and the mounting structure;
       a first base plate;
       a first side wall extending downward from the second bottom surface to the first base plate;
       wherein the first base plate extends from the first side wall in a direction away from the side edge,
   wherein the at least two module rails are pivotally connected to the at least two supporting beams;
   wherein the supporting beams can be moved to a relative position adjacent to each other by moving the module rails from a first orientation substantially perpendicular to the supporting beams to a second orientation substantially oblique to the supporting beams.

2. The collapsible photovoltaic module mounting assembly framework of claim 1, wherein the supporting beams comprise steel.

3. The collapsible photovoltaic module mounting assembly framework of claim 1, wherein the supporting beams comprise aluminum.

4. The collapsible photovoltaic module mounting assembly framework of claim 1, wherein the photovoltaic module rails comprise steel.

5. The collapsible photovoltaic module mounting assembly framework of claim 1, wherein the photovoltaic module rails comprise aluminum.

6. The collapsible photovoltaic module mounting assembly framework of claim 1, further comprising an array of a plurality of photovoltaic modules provided in a plurality of rows and columns, wherein at least one photovoltaic module of the plurality of photovoltaic modules comprises a bottom surface in contact with the second top surface.

7. The collapsible photovoltaic module mounting assembly framework of claim 6, wherein the photovoltaic module mounting assembly framework is configured to position an array of 15 photovoltaic modules in a configuration comprising 3 rows of modules and 5 columns of modules.

8. The collapsible photovoltaic module mounting assembly framework of claim 1, further comprising a lock that locks the module rails in an orientation substantially perpendicular to the supporting beams.

9. The collapsible photovoltaic module mounting assembly framework of claim 8, wherein the lock can unlock to allow the module rails to be moved to an orientation substantially oblique to the supporting beams.

10. A photovoltaic module ground mounting system comprising:
    a photovoltaic module;
    a supporting column comprising an upper end, wherein the supporting column can be installed perpendicular to a surface;
    a bracket adjacent to the upper end of the supporting column;
    a collapsible photovoltaic module mounting assembly framework configured to be mounted adjacent to the bracket, the module mounting assembly framework comprising:
    two substantially parallel supporting beams;
    at least two substantially parallel photovoltaic module rails each configured to secure a portion of a photovoltaic module, each photovoltaic module rail having:

a top plate having a first top surface and a first bottom surface opposite the first top surface, wherein the first bottom surface faces the at least two supporting beams;

a mounting structure having a second top surface and a second bottom surface opposite the second top surface, wherein the second top surface contacts the photovoltaic module; and a side edge extending upward from the first top surface to the second bottom surface, adjacent to the top plate and the mounting structure; and a photovoltaic module mounted to the second top surface;

wherein each of the module rails is pivotally connected to both of the supporting beams;

wherein the supporting beams can be moved to a relative position adjacent to each other by moving the module rails from a first orientation substantially perpendicular to the supporting beams to a second orientation substantially oblique to the supporting beams.

11. The photovoltaic module ground mounting system of claim 10, wherein the supporting beams comprise steel.

12. The photovoltaic module ground mounting system of claim 10, wherein the supporting beams comprise aluminum.

13. The photovoltaic module ground mounting system of claim 10, wherein the photovoltaic module rails comprise steel.

14. The photovoltaic module ground mounting system of claim 10, wherein the photovoltaic module rails comprise aluminum.

15. The photovoltaic module ground mounting system of claim 10, wherein the photovoltaic module mounting assembly framework is configured to position an array of a plurality of photovoltaic modules in a plurality of rows and columns.

16. The photovoltaic module ground mounting system of claim 10, wherein the photovoltaic module mounting assembly framework is configured to position an array of 15 photovoltaic modules in a configuration comprising 3 rows of modules and 5 columns of modules.

17. The photovoltaic module ground mounting system of claim 10, wherein the supporting column comprises steel.

18. The photovoltaic module ground mounting system of claim 10, wherein the supporting column comprises aluminum.

19. The photovoltaic module ground mounting system of claim 10, wherein the bracket comprises steel.

20. The photovoltaic module ground mounting system of claim 10, wherein the bracket comprises aluminum.

21. The photovoltaic module ground mounting system of claim 10, wherein the bracket can be positioned to provide a module mounting position tilted with respect to the plane of a surface adjacent to which the supporting column can be installed.

22. The photovoltaic module ground mounting system of claim 10, further comprising a shipping cradle configured to conform to and encase the module mounting assembly framework in the collapsed position.

23. A method of installing a photovoltaic module mounting system comprising the steps of:

positioning a supporting column comprising a bracket adjacent to a surface, wherein the bracket is adjacent to the upper end of the supporting column;

attaching a collapsible photovoltaic module mounting assembly framework to the bracket, wherein the collapsible photovoltaic module mounting assembly framework comprises:

two substantially parallel supporting beams;

at least two substantially parallel photovoltaic module rails each configured to secure a portion of a photovoltaic module, each photovoltaic module rail having:

a top plate having a first top surface and a first bottom surface opposite the first top surface, wherein the first bottom surface faces the at least two supporting beams;

a mounting structure having a second top surface and a second bottom surface opposite the second top surface, wherein the second top surface is configured to contact a photovoltaic module; and a side edge extending upward from the first top surface to the second bottom surface, adjacent to the top plate and the mounting structure, wherein each of the module rails is pivotally connected to both of the supporting beams;

wherein the supporting beams can be moved to a relative position adjacent to each other by moving the module rails from a first orientation substantially perpendicular to the supporting beams to a second orientation substantially oblique to the supporting beams; and mounting a photovoltaic module to the second top surface.

24. The method of claim 23, wherein the supporting beam comprises steel.

25. The method of claim 23, further comprising the step of attaching a photovoltaic module to a photovoltaic module rail of the module mounting assembly framework.

26. The method of claim 23, further comprising the step of adjusting the bracket to provide a module mounting position tilted compared to the surface.

27. The collapsible photovoltaic module mounting assembly framework of claim 1, wherein each module rail includes a first end portion and a second end portion, and one of the connected supporting beams is positioned under the first end portion of each module rail, and the other of the connected supporting beams is positioned under the second end portion of each module rail.

28. The photovoltaic module ground mounting system of claim 10, wherein each module rail includes a first end portion and a second end portion, and one of the connected supporting beams is positioned under the first end portion of each module rail, and the other of the connected supporting beams is positioned under the second end portion of each module rail.

* * * * *